(12) United States Patent
Yum et al.

(10) Patent No.: US 9,865,778 B2
(45) Date of Patent: Jan. 9, 2018

(54) LIGHT EMITTING DEVICE AND LIGHTING APPARATUS HAVING SAME

(71) Applicant: LG INNOTEK CO., LTD., Seoul (KR)

(72) Inventors: Woong Sun Yum, Seoul (KR); Ji Hyun Koo, Seoul (KR); Hyun Ju Kim, Seoul (KR); Kyung Wook Park, Seoul (KR); Sung Ho Choo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/301,166

(22) PCT Filed: Apr. 2, 2015

(86) PCT No.: PCT/KR2015/003294
§ 371 (c)(1),
(2) Date: Sep. 30, 2016

(87) PCT Pub. No.: WO2015/152652
PCT Pub. Date: Oct. 8, 2015

(65) Prior Publication Data
US 2017/0125638 A1    May 4, 2017

(30) Foreign Application Priority Data
Apr. 3, 2014  (KR) .................. 10-2014-0039992

(51) Int. Cl.
*H01L 33/40* (2010.01)
*H01L 33/00* (2010.01)
(Continued)

(52) U.S. Cl.
CPC ........ *H01L 33/405* (2013.01); *H01L 33/0008* (2013.01); *H01L 33/0075* (2013.01);
(Continued)

(58) Field of Classification Search
CPC .............................. H01L 33/405; H01L 33/22
See application file for complete search history.

(56) References Cited

U.S. PATENT DOCUMENTS

2005/0145876 A1    7/2005  Kwak et al.
2008/0185609 A1    8/2008  Kozawa et al.
(Continued)

FOREIGN PATENT DOCUMENTS

EP    2 860 774 A1    4/2015
JP    2012-77345 A    4/2012
(Continued)

*Primary Examiner* — Michael Jung
*Assistant Examiner* — Mikka Liu
(74) *Attorney, Agent, or Firm* — Birch, Stewart, Kolasch & Birch, LLP

(57) ABSTRACT

A light-emitting device discloses a light emitting structure layer including an active layer between first and second conductive semiconductor layers, a first electrode electrically connected to the first conductive semiconductor layer, a contact layer disposed under the second conductive semiconductor layer, a reflective layer disposed under the contact layer, a capping layer disposed under the reflective layer, and a conductive supporting member disposed under the capping layer. The reflective layer comprises a thickness that is greater than the thickness of the second conductive semiconductor layer and 90 or more times greater than the thickness of the contact layer.

20 Claims, 13 Drawing Sheets

(51) Int. Cl.
*H01L 33/38* (2010.01)
*H01L 33/22* (2010.01)
*H01L 33/62* (2010.01)
*H01L 33/32* (2010.01)

(52) U.S. Cl.
CPC .......... *H01L 33/0079* (2013.01); *H01L 33/22* (2013.01); *H01L 33/32* (2013.01); *H01L 33/382* (2013.01); *H01L 33/62* (2013.01)

(56) References Cited

U.S. PATENT DOCUMENTS

| | | |
|---|---|---|
| 2009/0278150 A1 | 11/2009 | Lee et al. |
| 2011/0089452 A1* | 4/2011 | Jeong .................... H01L 33/405 257/98 |
| 2012/0305964 A1* | 12/2012 | Akaike ............... H01L 33/0079 257/98 |
| 2013/0026525 A1* | 1/2013 | Chen ....................... H01L 33/62 257/98 |
| 2013/0193416 A1 | 8/2013 | Shin |
| 2015/0137159 A1 | 5/2015 | Jeong |

FOREIGN PATENT DOCUMENTS

| | | |
|---|---|---|
| JP | 2013-128076 A | 6/2013 |
| KR | 10-2007-0016897 A | 2/2007 |
| KR | 10-2013-0007126 A | 1/2013 |
| KR | 10-2013-0072752 A | 7/2013 |
| KR | 10-2013-086665 A | 8/2013 |
| KR | 10-2014-0009624 A | 1/2014 |
| WO | WO 2013/183878 A1 | 12/2013 |

\* cited by examiner

[FIG. 1]
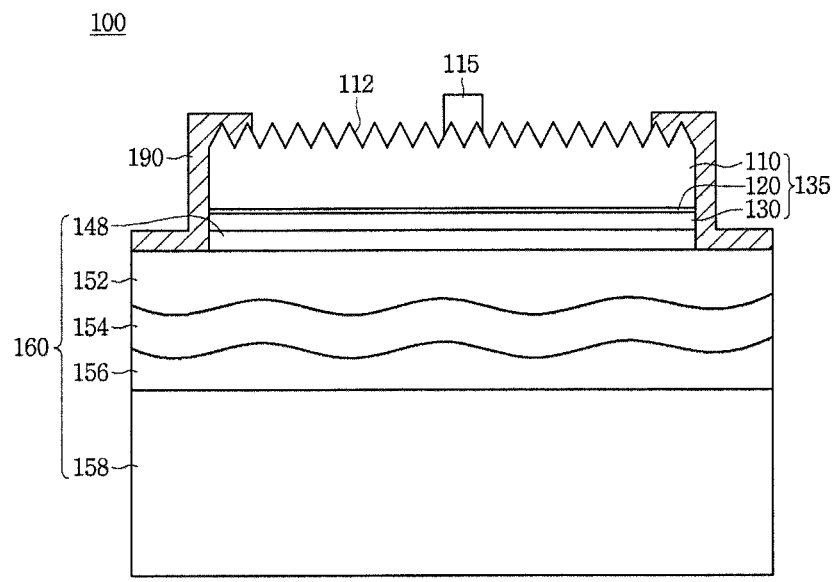
[FIG. 2]
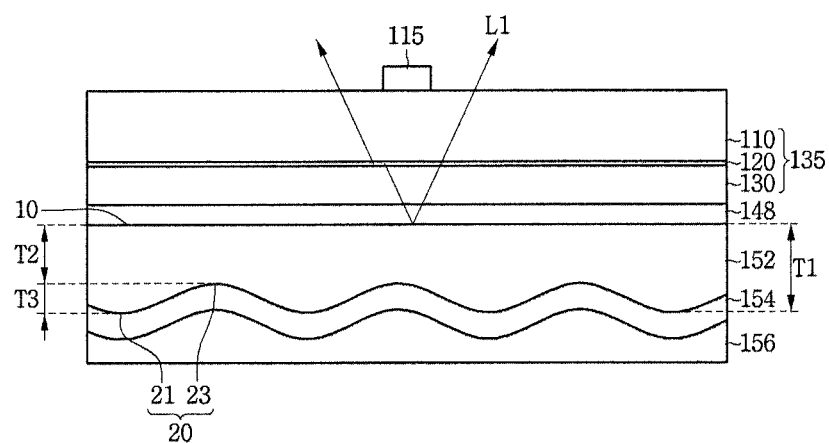
[FIG. 3]
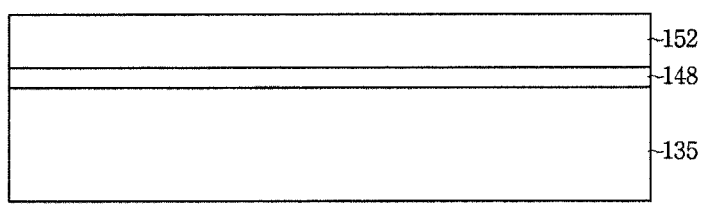

[FIG. 4]
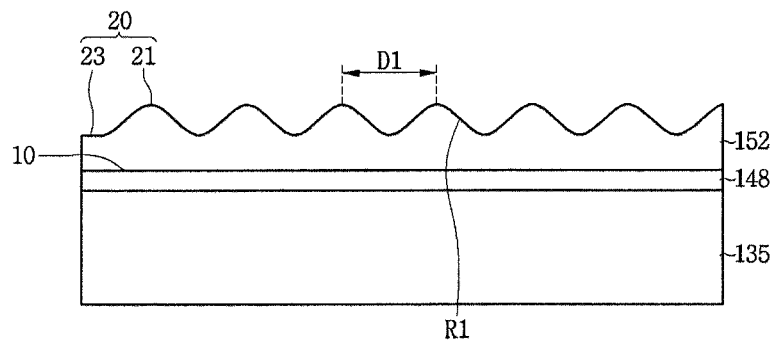
[FIG. 5]
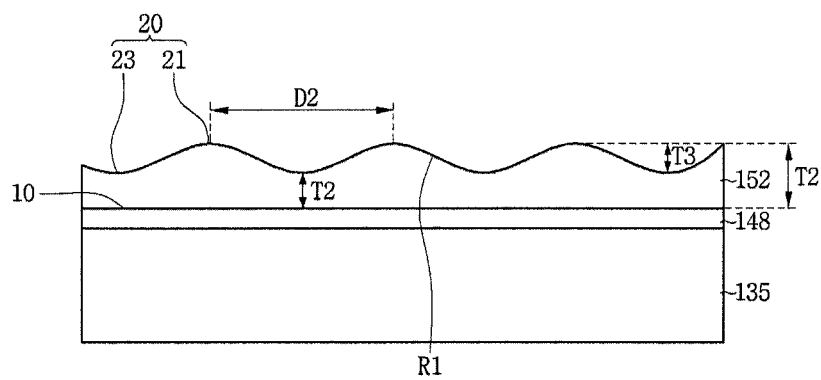
[FIG. 6]
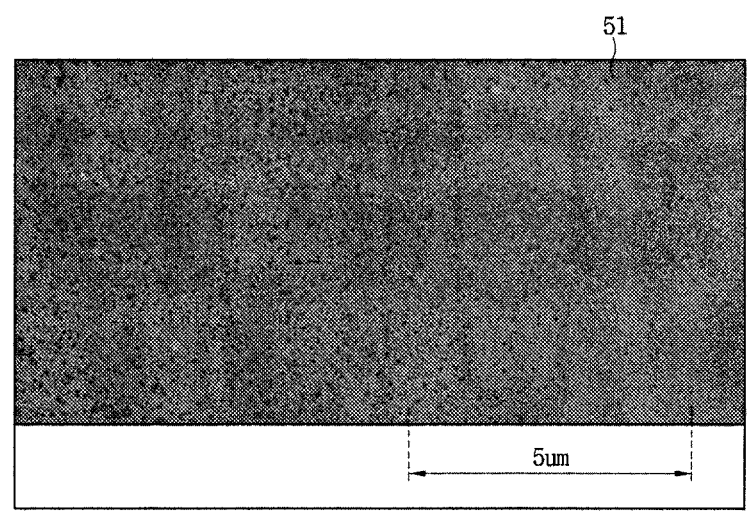

[FIG. 7]
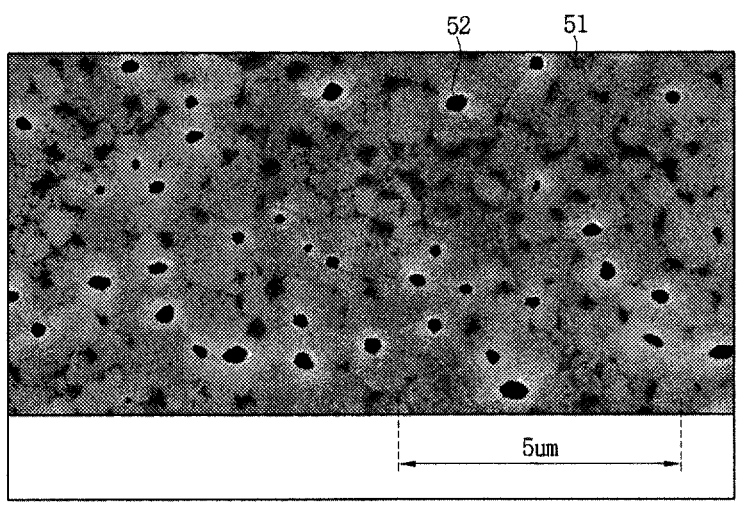
[FIG. 8]
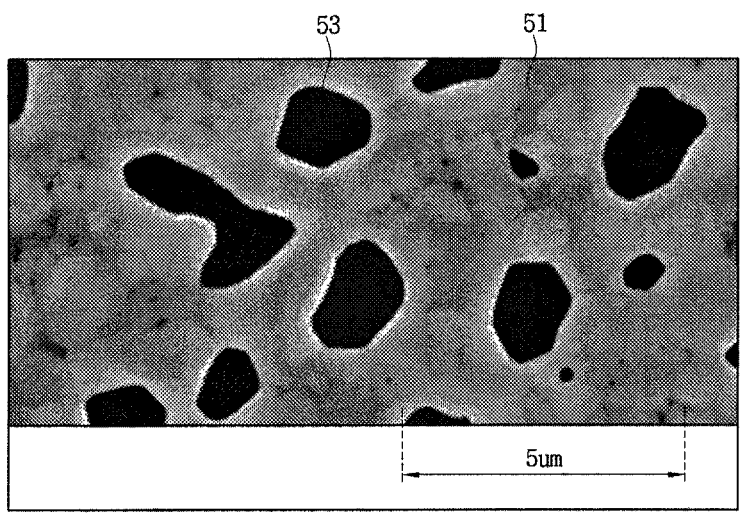

[FIG. 9]
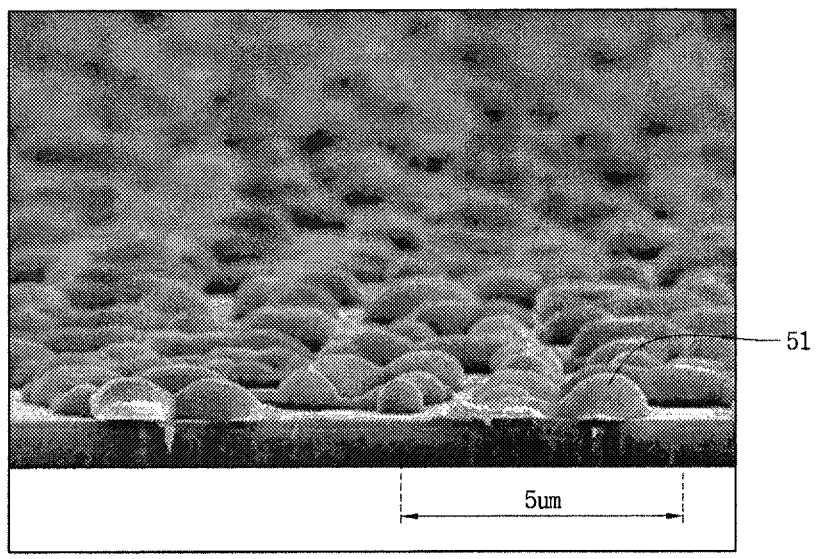
[FIG. 10]
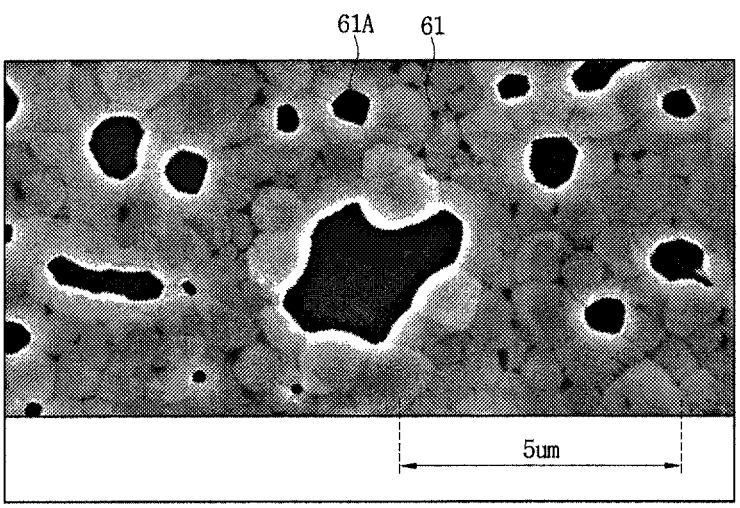

[FIG. 11]
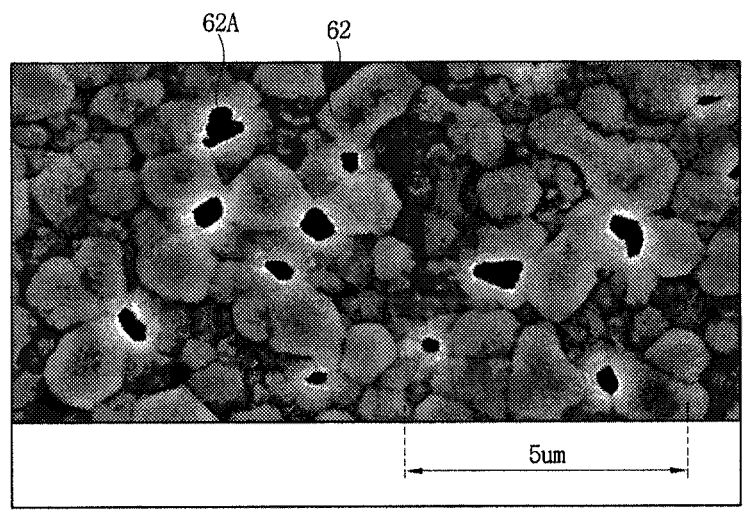
[FIG. 12]
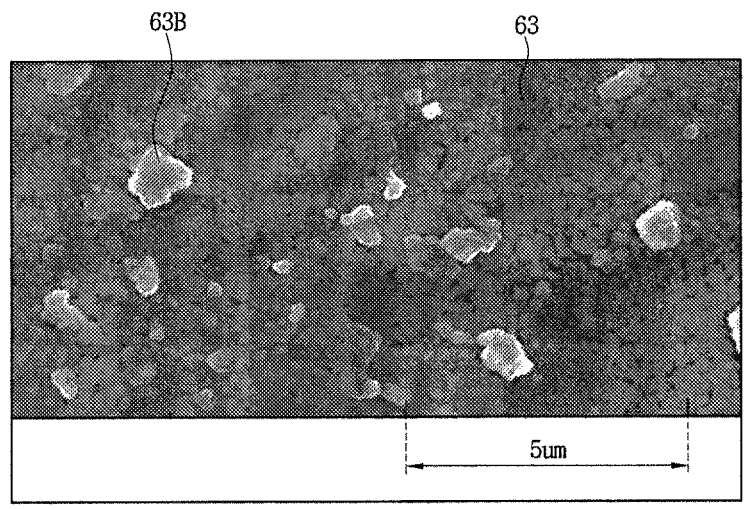

[FIG. 13]
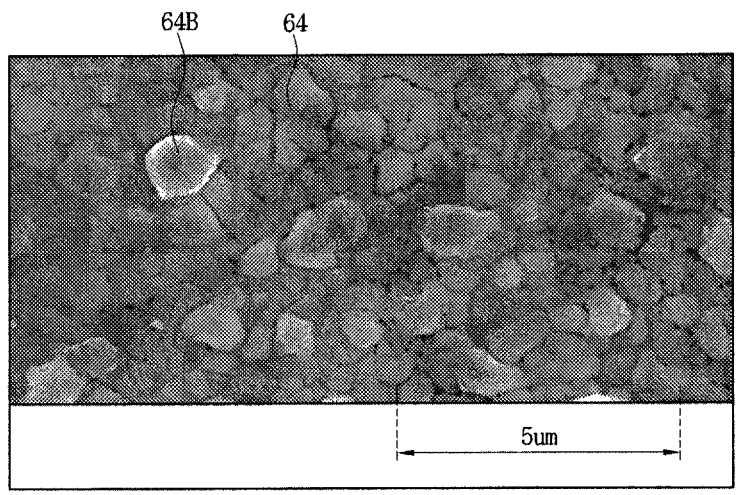
[FIG. 14]
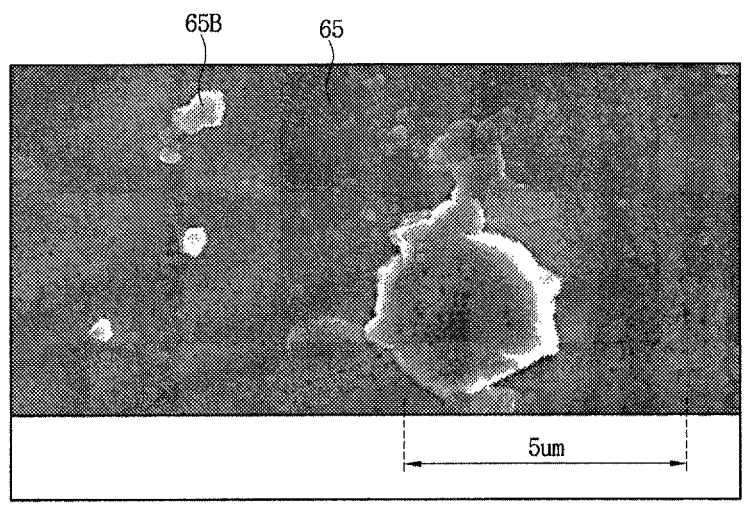

[FIG. 15]
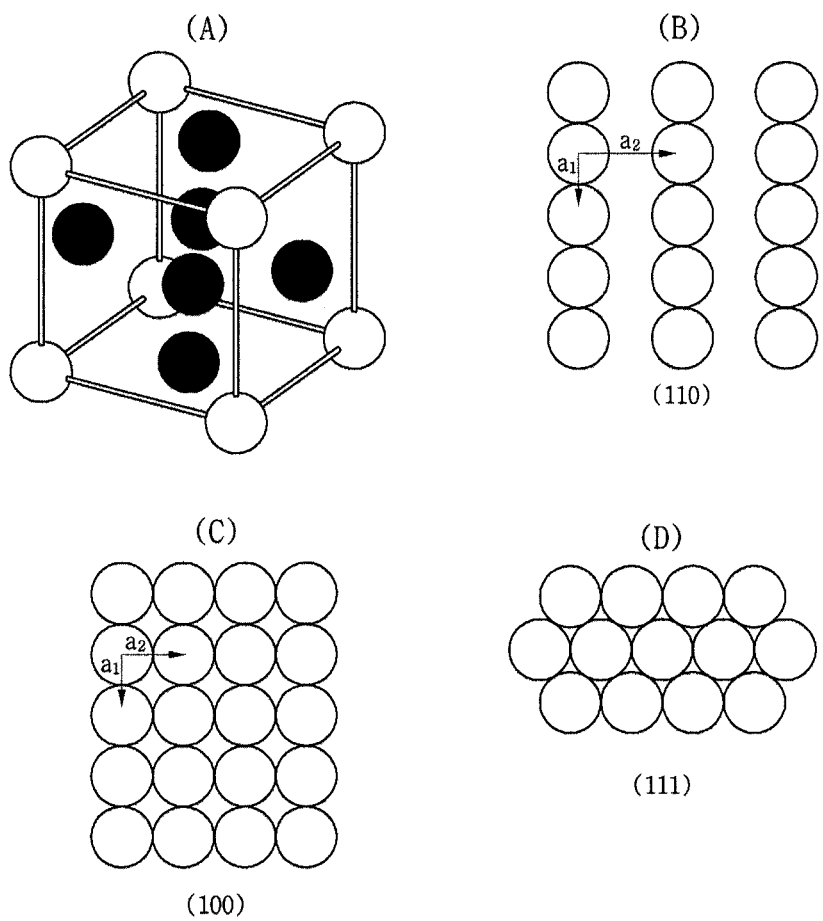

[FIG. 16]
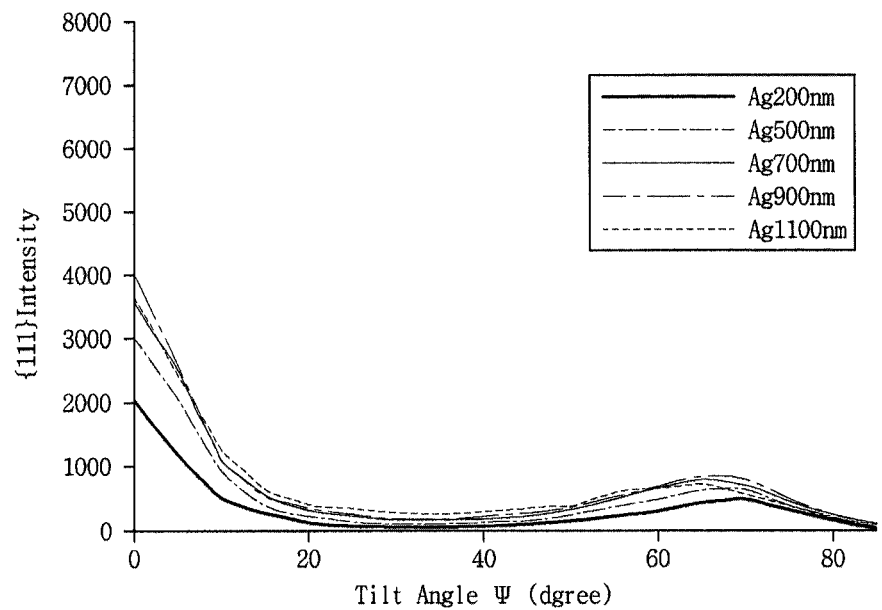
[FIG. 17]
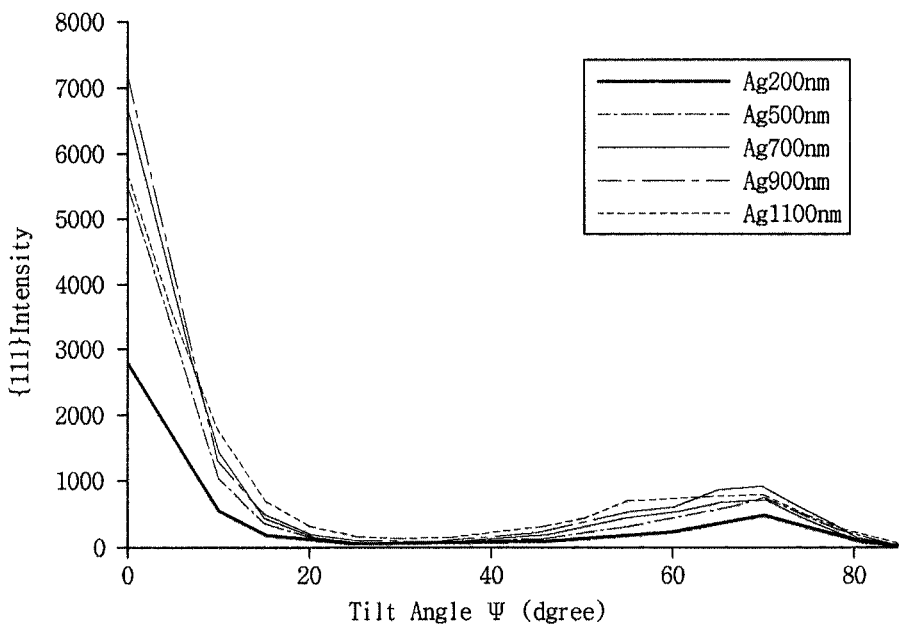

[FIG. 18]

| No. | Test | Po [mW] | Po ↑ |
|---|---|---|---|
| 01 | Ref | 518.7 | |
| | 900nm | 531 | 12.3 (2.37%) |

(A)

| No. | Test | Po [mW] | Po ↑ |
|---|---|---|---|
| 02 | Ref | 527.04 | |
| | 900nm | 541.98 | 14.94 (2.83%) |

(B)

| No. | Test | Po [mW] | Po ↑ |
|---|---|---|---|
| 03 | Ref | 526.92 | |
| | 900nm | 541.03 | 14.11 (2.63%) |

| | Wafer 1 | | Wafer 2 | | Wafer 3 | |
|---|---|---|---|---|---|---|
| | 200nm | 900nm | 500nm | 900nm | 900nm | 1300nm |
| HEAT TREATMENT AT 400°C | 92.4 | 92.49 | 93.13 | 93.65 | 93.01 | 93.45 |
| AFTER BONDING PROCESS | 91.82 | 92.48 | 93.21 | 93.66 | 93.01 | 93.46 |
| Δ reflectance flectance | -0.58 | -0.01 | 0.08 | 0.01 | 0 | 0.01 |

[FIG. 20]
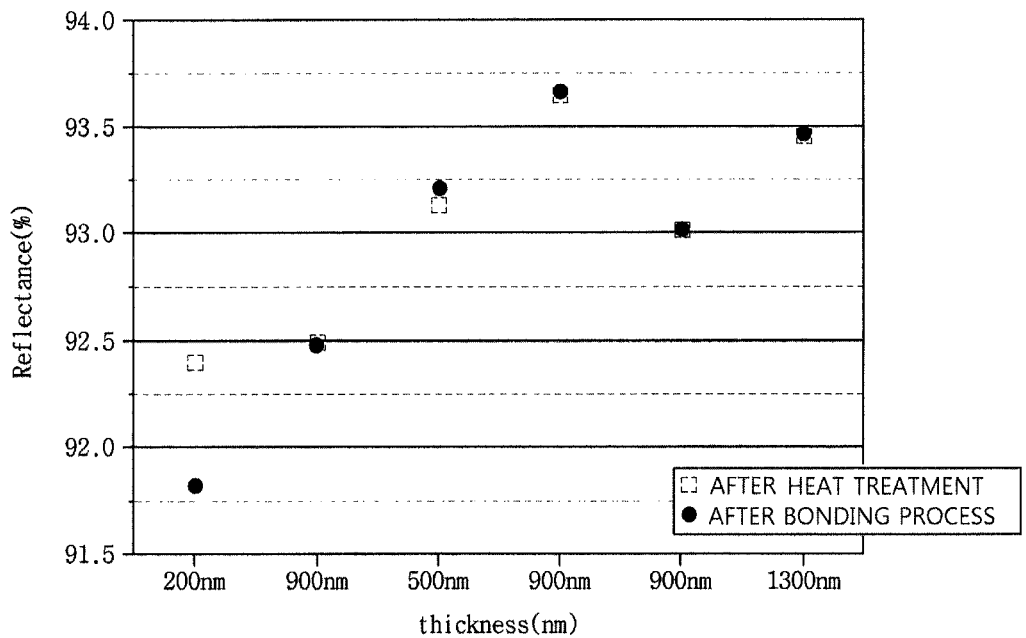
[FIG. 21]
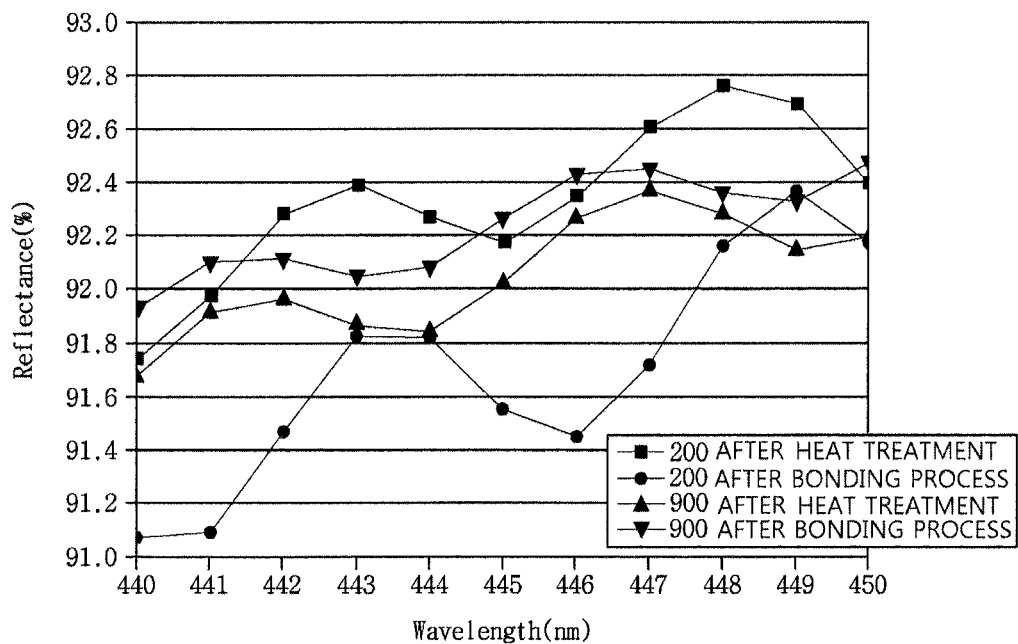

[FIG. 22]
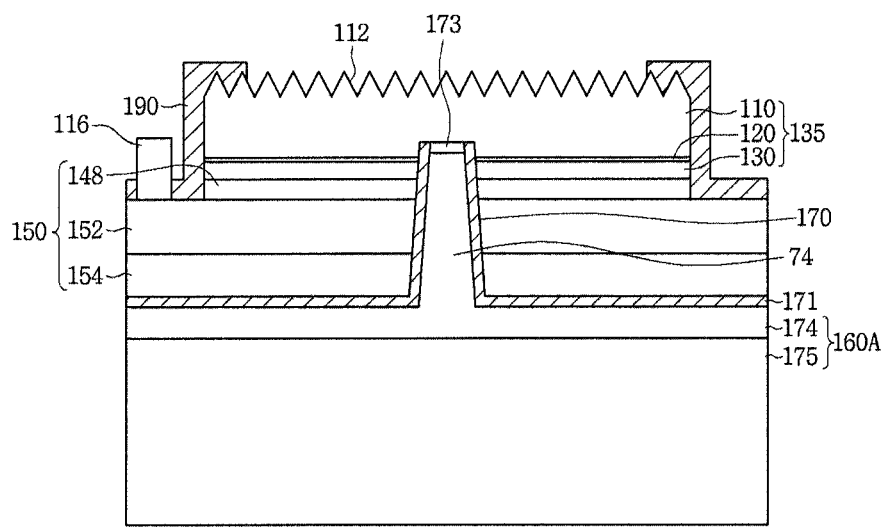
[FIG. 23]
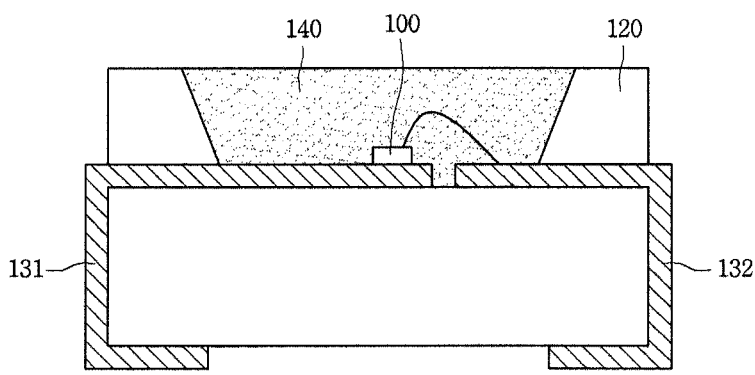

[FIG. 24]
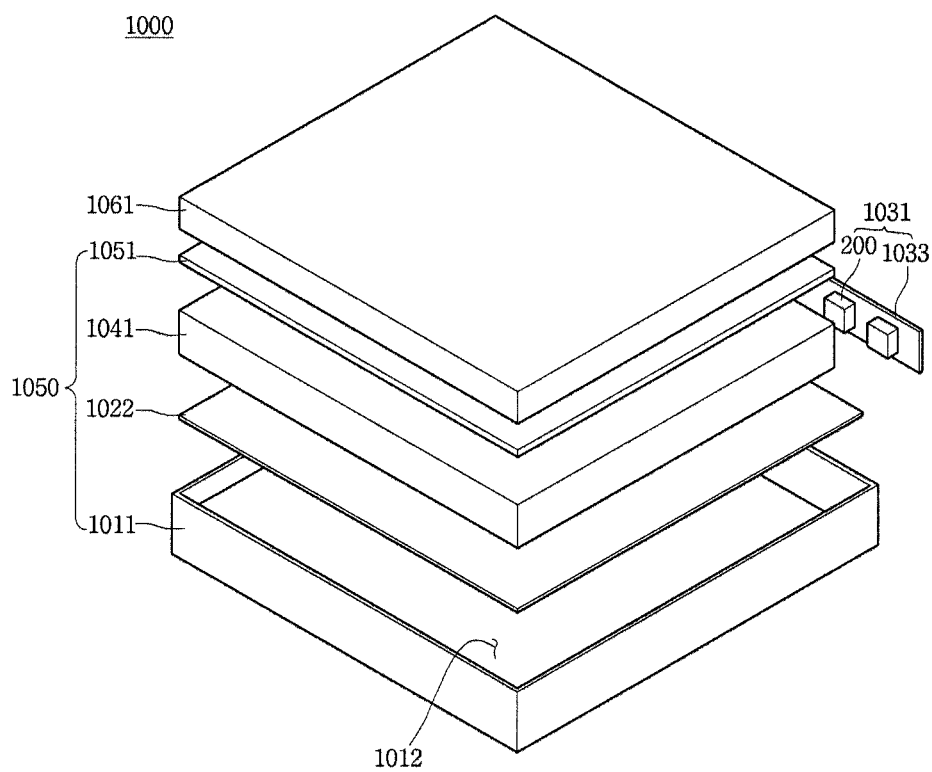
[FIG. 25]
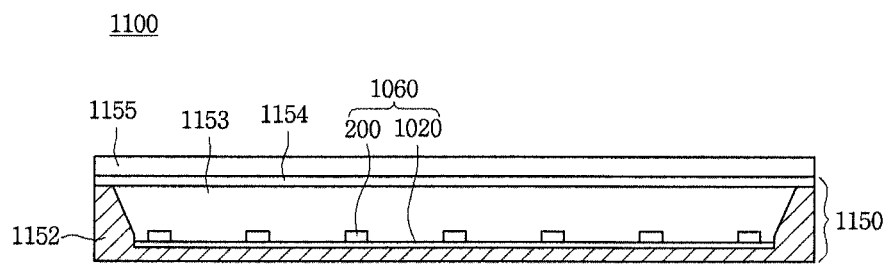

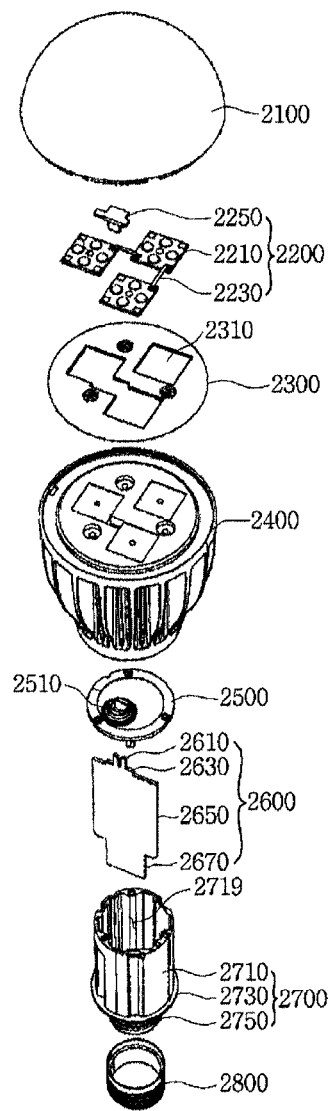
[FIG. 26]

LIGHT EMITTING DEVICE AND LIGHTING APPARATUS HAVING SAME

CROSS REFERENCE TO RELATED APPLICATIONS

This application is the National Phase of PCT/KR2015/003294 filed on Apr. 2, 2015, which claims priority under 35 U.S.C. §119(a) to Korean Patent Application No. 10-2014-0039992 filed on Apr. 3, 2014, all of which are hereby expressly incorporated by reference into the present application.

TECHNICAL FIELD

Embodiments relate to a light emitting device and a lighting apparatus including the same.

BACKGROUND ART

Group III-V nitride semiconductors have been spotlighted as a core material of light emitting devices, such as light emitting diodes (LEDs) or laser diodes (LDs), due to physical and chemical characteristics thereof. A Group III-V nitride semiconductor is generally formed of a semiconductor material having a formula of $I_xAl_yGa_{1-x-y}N$ ($0 \leq x \leq 1$, $0 \leq y \leq 1$, $0 \leq x+y \leq 1$).

A light emitting diode (LED) is a semiconductor device which converts electricity into infrared or visible light using characteristics of compound semiconductors to exchange signals, and is used as a light source.

LEDs or LDs using such a nitride semiconductor material are widely used for light emitting devices for obtaining light and are used as light sources of various types of products such as a keypad light emitting unit of a mobile phone, a display apparatus, an electronic display board and a lighting apparatus.

DISCLOSURE

Technical Problem

Embodiments provide a light emitting device having improved luminosity.

Embodiments provide a light emitting device in which a reflective layer is disposed under a light emitting structure layer and a depth of a recess of the reflective layer is less than a thickness of the reflective layer.

Embodiments provide a light emitting device in which a through-hole is not formed in a reflective layer disposed under a light emitting structure layer.

Technical Solution

A light emitting device according to an embodiment includes a light emitting structure layer including a first conductivity type semiconductor layer, a second conductivity type semiconductor layer disposed under the first conductivity type semiconductor layer and an active layer disposed between the first conductivity type semiconductor layer and the second conductivity type semiconductor layer, a first electrode electrically connected to the first conductivity type semiconductor layer, a contact layer disposed under the second conductivity type semiconductor layer and formed of a conductive material, a reflective layer disposed under the contact layer, a capping layer disposed under the reflective layer, and a conductive support member disposed under the capping layer. A thickness of the reflective layer is greater than that of the second conductivity type semiconductor layer and is 90 or more times that of the contact layer.

Advantageous Effects

Embodiments can improve light output of a light emitting device.

Embodiments provide a light emitting device capable of improving reflectance of a reflective layer disposed under a light emitting structure layer.

Embodiments can improve optical property deterioration of a light emitting device.

Embodiments can improve reliability of a light emitting device and a light emitting device package, lighting apparatus and display apparatus including the same.

DESCRIPTION OF DRAWINGS

FIG. 1 is a side cross-sectional view showing a light emitting device according to a first embodiment.

FIG. 2 is a partial enlarged view showing a reflective layer of the light emitting device of FIG. 1.

FIGS. 3 to 5 are views showing change of the reflective layer according to heat treatment in the light emitting device of FIG. 2.

FIGS. 6 to 9 are views showing surfaces according to a heat treatment temperature of the reflective layer according to a comparative example.

FIGS. 10 to 14 are views showing surfaces according to change in thickness of the reflective layer according to a comparative example and an embodiment.

FIGS. 15(A) to 15(D) are views showing a crystallographic structure of Ag and an example in which a crystal direction is changed according to thermal energy.

FIG. 16 is a graph showing comparison of intensity according to a difference in thickness of the reflective layer after the reflective layer is deposited according to an embodiment and a comparative example.

FIG. 17 is a graph showing comparison of intensity according to a difference in thickness of the reflective layer after the reflective layer is subjected to heat treatment according to an embodiment and a comparative example.

FIG. 18 is a view showing an average of light output of a wafer using the reflective layer according to an embodiment and comparison between light outputs of adjacent light emitting devices.

FIG. 19 is a table showing comparison of reflectance between an embodiment and a comparative example after heat treatment and after a bonding process in a wafer.

FIG. 20 is a view showing reflectance according to the thickness of the reflective layer of FIG. 19.

FIG. 21 is a graph showing comparison of reflectance according to wavelength between an embodiment and a comparative example.

FIG. 22 is a side cross-sectional view of a light emitting device according to a second embodiment.

FIG. 23 is a view showing a light emitting device package including a light emitting device according to an embodiment.

FIG. 24 is a diagram showing a display apparatus including the light emitting device package of FIG. 23.

FIG. 25 is a diagram showing another example of the display apparatus including the light emitting device package of FIG. 23.

FIG. 26 is a diagram showing a lighting apparatus including the light emitting device package of FIG. 23.

BEST MODE

Hereinafter, a light emitting device and a method of manufacturing the same according to embodiments will be described in detail with reference to the accompanying drawings. In the following description of the embodiments, it will be understood that, when each layer (film), region, pattern or structure is referred to as being formed "on" or "under" a substrate or each layer (film), region, pad, pattern or structure, it can be directly "on" or "under" a substrate or each layer (film), region, pad or pattern or be indirectly formed with one or more intervening layers therebetween. In addition, it will also be understood that "on" or "under" the layer may mean an upward direction and a downward direction of the layer.

FIG. 1 is a side cross-sectional view showing a light emitting device according to a first embodiment.

Referring to FIG. 1, the light emitting device 100 may include a light emitting structure layer 135 having a plurality of compound semiconductor layers 110, 120 and 130, a first electrode 115 connected to the light emitting structure layer 135, a contact layer 148 disposed under the light emitting structure layer 135, a reflective layer 152 disposed under the contact layer 148, a capping layer 154 disposed under the reflective layer 152, a bonding layer 156 disposed under the capping layer 154, and a support member 158 disposed under the bonding layer 156.

The light emitting device 100 is a light emitting diode (LED) including compound semiconductors, e.g., compound semiconductors of Group II to VI elements. The light emitting device 100 includes the light emitting structure layer 135 including compound semiconductors of Group III-V elements and Group II-V elements, for example. The light emitting device 100 emits visible light or ultraviolet light.

An insulation layer 190 may be disposed on the side and upper surfaces of the light emitting structure layer 135. The insulation layer 190 has a refractive index less than that of a compound semiconductor layer, e.g., a compound semiconductor layer of Group III-V elements and may be selected from among $SiO_2$, $SiO_x$, $SiO_xN_y$, $Si_3N_4$, $Al_2O_3$ and $TiO_2$.

The first electrode 115 may be disposed on the light emitting structure layer 135. The first electrode 115 may be electrically connected to a first conductivity type semiconductor layer 110. The first electrode 115 may include a pad or an electrode pattern having a branch structure connected to the pad. The first electrode 115 may include a single or plurality of pads, without being limited thereto. A roughness having irregularities may be formed on an upper surface of the first electrode 115, without being limited thereto. A lower surface of the first electrode 115 may be formed in an uneven shape by a light extraction structure 112 of the light emitting structure layer 135. The first electrode 115 may include a single layer or multiple layers by mixing any one or a plurality of metal materials selected from among Cr, Ti, Al, In, Ta, Pd, Co, Ni, Si, Ge, Ag, Cu and Au, for example.

The light emitting structure layer 135 includes a first conductivity type semiconductor layer 110, an active layer 120 and a second conductivity type semiconductor layer 130. The light emitting structure layer 135 may further include the other layers in addition to the layers 110, 120 and 130, without being limited thereto.

The light emitting structure layer 135 may be grown on a growth substrate using a growth apparatus such as an electron beam evaporator, a physical vapor deposition (PVD) device, a chemical vapor deposition (CVD) device, a plasma laser deposition (PLD) device, a dual-type thermal evaporator, a sputtering device, a metal organic chemical vapor deposition (MOCVD) device, etc., without being limited thereto.

The first conductivity type semiconductor layer 110 may be selected from among compound semiconductors of Group III-V elements doped with a first conductivity type dopant, such as GaN, AlN, AlGaN, InGaN, InN, InAlGaN, AlInN, AlGaAs, GaP, GaAs, GaAsP, AlGaInP, GaP, etc. The first conductivity type semiconductor layer 110 may include a semiconductor layer having a formula of $In_xAl_yGa_{1-x-y}N$ (0≤x≤1, 0≤y≤1, 0≤x+y≤1). The first conductivity type semiconductor layer 110 is an n-type semiconductor layer and the first conductivity type dopant includes n-type dopants such as Si, Ge, Sn, Se and Te. The first conductivity type semiconductor layer 110 may include a single layer or multiple layers, without being limited thereto. A roughness or pattern such as a light extraction structure 112 may be formed on the upper surface of the first conductivity type semiconductor layer 110. In addition, for current spreading and light extraction, a transparent electrode layer may be selectively formed on the first conductivity type semiconductor layer 110, without being limited thereto. The first conductivity type semiconductor layer 110 may be electrically connected to the first electrode 115.

The active layer 120 may be disposed under the first conductivity type semiconductor layer 110 and may be formed in at least one of a single quantum well structure, a multi quantum well structure, a quantum-wire structure or a quantum dot structure. The active layer 120 may be formed of a cycle of a well layer and a barrier layer using compound semiconductor materials of Group II-VI elements and Group III-V elements. The active layer 120 may be formed of a cycle of an InGaN well layer/GaN barrier layer, a cycle of an InGaN well layer/AlGaN barrier layer or a cycle of an InGaN well layer/InGaN barrier layer. The barrier layer may be formed of a material having a band gap greater than that of the well layer. The active layer 120 may emit light having a peak wavelength of at least one of visible light and ultraviolet light.

A first clad layer and/or a second clad layer may be formed on and/or under the active layer 120. The first and second clad layers may be formed of a GaN semiconductor and the band gap thereof may be greater than that of the barrier layer of the active layer 120.

The second conductive semiconductor layer 130 is disposed under the active layer 120 and may be selected from among compound semiconductors of Group III-V elements doped with a second conductivity type dopant, such as GaN, AlN, AlGaN, InGaN, InN, InAlGaN, AlInN, AlGaAs, GaP, GaAs, GaAsP, AlGaInP and GaP. The second conductivity type semiconductor layer 130 may include a semiconductor layer having a formula of $In_xAl_yGa_{1-x-y}N$ (0≤x≤1, 0≤y≤1, 0≤x+y≤1). The second conductivity type semiconductor layer 130 is a p-type semiconductor layer and the second conductivity type dopant includes a p-type dopant such as Mg or Zn. The second conductivity type semiconductor layer 130 may include a single layer or multiple layers, without being limited thereto.

The side surface of the light emitting structure layer 135 may be vertical to or inclined to the lower surface of the light emitting structure layer 135. The width of the upper surface of the light emitting structure layer 135 may be equal to or greater than that of the lower surface of the light emitting structure layer 135.

The light emitting structure layer 135 may further include a first conductivity type semiconductor layer under the second conductivity type semiconductor layer 130 and the first conductivity type semiconductor layer may have polarity opposite to that of the second conductivity type semiconductor layer. In addition, the first conductivity type semiconductor layer 110 may be a p-type semiconductor layer and the second conductivity type semiconductor layer 130 may be an n-type semiconductor layer. The light emitting structure layer 135 may include at least one of an n-p junction, a p-n junction, an n-p-n junction and a p-n-p junction. Hereinafter, for convenience of description, assume that the lowermost layer of the light emitting structure layer 135 is a second conductivity type semiconductor layer.

A plurality of conductive layers may be disposed under the second conductivity type semiconductor layer 130 and the plurality of conductive layers may be defined as a second electrode layer 160. The second electrode layer 160 includes the contact layer 148, the reflective layer 152, the capping layer 154, the bonding layer 156 and the support member 158.

The contact layer 148 is disposed between the light emitting structure 135 and the reflective layer 152 and may be in contact with the lower surface of the second conductive semiconductor layer 130. The width of the contact layer 148 may be equal to or different from that of the lower surface of the second conductivity type semiconductor layer 130.

The contact layer 148 may include a transparent conductive material and may be in contact with the second conductivity type semiconductor layer 130. The contact layer 148 may be an ohmic contact layer. The contact layer 148 may have a thickness in a range of 3 nm to 40 nm, for example, 3 nm to 10 nm and includes conductive oxide or conductive nitride. The contact layer may include at least one of indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO) and gallium zinc oxide (GZO), for example.

The reflective layer 152 may be disposed under the contact layer 148 and the reflective layer 152 may be entirely or partially disposed on the lower surface of the contact layer 148.

The reflective layer 152 is electrically connected to the contact layer 148 to supply voltage. A portion of the reflective layer 152 may be in contact with the second conductivity type semiconductor layer 130 through the contact layer 148, without being limited thereto. The width of the reflective layer 152 may be equal to or greater than that of the light emitting structure layer 135. If the width of the reflective layer 152 is greater than that of the contact layer 148, it is possible to efficiently reflect incident light. Accordingly, it is possible to improve light extraction efficiency.

The reflective layer 152 may include a single layer or multiple layers selectively formed of Ag, Ni, Al, Rh, Pd, Ir, Ru, Mg, Zn, Pt, Au, Hf and a selective combination thereof. The reflective layer 152 may include Ag or an Ag alloy, for example, and may include a single layer.

The thickness of the reflective layer 152 may be greater than that of the second conductivity type semiconductor layer 130 or 20 or more times, e.g., 90 or more times the thickness of the contact layer 148. The thickness of the reflective layer 152 is in a range of 700 to 1500 nm, for example, 800 to 1400 nm or 900 to 1300 nm. If the thickness of the reflective layer 152 is less than 700 nm, a plurality of holes or recesses may be formed due to heat treatment. The holes of the reflective layer 152 may be through-holes formed in the reflective layer and have an irregular shape when viewed from the capping layer. When the thickness of the reflective layer 152 exceeds 1500 nm, the thickness of the light emitting device becomes thick and there is no reflectance difference. The thickness of the reflective layer 152 according to the embodiment may be large enough not to form a hole, that is, a hole having an irregular shape, in the reflective layer 152. Here, the hole having the irregular shape is formed by heat treatment and has a shape different from that of a hole formed through etching.

The capping layer 154 may be disposed between the reflective layer 152 and the bonding layer 156. The capping layer 154 is in contact with the lower surface of the reflective layer 152 and protects the reflective layer 152. That is, the capping layer 154 can prevent the material of the bonding layer 156 from diffusing into the reflective layer 152 and influencing the reflective layer 152 during a manufacturing process. The capping layer 154 may include a metal. For example, the capping layer may include at least one of Au, Cu, Ni, Ti, Ti—W, Cr, W, Pt, V, Fe and Mo. The thickness of the capping layer 154 may be in a range of 40 to 500 nm, for example, 40 nm to 60 nm. The thickness of the reflective layer 152 may be 15 or more times the thickness of the capping layer 154.

The bonding layer 156 may be disposed between the capping layer 154 and the support member 158. The bonding layer 156 includes a barrier metal or a bonding metal. For example, the bonding metal may include at least one of Sn, Ga, In, Bi, Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2 O, Cu—Zn, Cu—P, Ni—B, Ni—Mn—Pd, Ni—P and Pd—Ni. The thickness of the bonding layer 156 may be in a range of 5 to 9 μm, without being limited thereto. Any one of the bonding layer 156 and the capping layer 154 may be omited.

The support member 158 may be disposed under the bonding layer 156. The support member 158 may be adhered to a circuit board using an adhesive member. The support member 158 may be implemented as a metal or carrier substrate, for example, a carrier substrate, into which Ti, Cr, Ni, Al, Pt, Au, W, Cu, Mo, Cu—W or impurities are injected. The carrier substrate may be formed of at least one of Si, Ge, GaN, GaAs, ZnO, SiC and SiGe, for example. The support member 158 supports the light emitting device 100 and the thickness thereof is 80% or more of the thickness of the second electrode layer 160 and may be in a range of 30 μm to 300 μm.

Referring to FIG. 2, the reflective layer 152 is disposed under the light emitting structure layer 135 and the contact layer 148 and includes a flat upper surface and a lower surface 20 having an uneven structure. Light emitted from the light emitting structure layer 135 is radiated in all directions and the reflective layer 152 reflects light L1 passing through the contact layer 148. Since light L1 reflected from the reflective layer 152 is radiated through an interface between the reflective layer 152 and the contact layer 148, if the through-hole is formed in the reflective layer 152, reflectance of the light L1 may deteriorate.

The lower surface 20 of the reflective layer 152 includes protrusion portions 21 and recesses 23, the recesses 23 may be convex in the direction of the light emitting structure layer 135, and the protrusion portions 21 protrude in the direction of the capping layer 156 in a region between the recesses 23.

A plurality of protrusion portions 21 may be formed on the lower surface 20 of the reflective layer 152 and a plurality of recesses may be formed between the plurality of protrusion portions 21. The protrusion portions 21 may be provided between the recesses 23 and the recesses 23 may be provided between the protrusion portions 21.

In the reflective layer 152, the thickness T2 between the recess 23 and the contact layer 148 or the upper surface of the reflective layer 152 may be less than the thickness T1 between the protrusion portion 21 and the contact layer 148.

In the reflective layer 152, the thickness T2 of the recess 23 may be greater than the depth T3 of the recess 23. The depth T3 of the recess 23 may be less than 50% of the thickness T1 of the reflective layer 152, for example. The depth T3 of the recess 23 may be the height of the protrusion portion 21. The depth T3 of the recess 23 may be equal to or less than 400 nm, for example, in a range of 10 nm to 400 nm. The thickness T1 of the reflective layer 152 may be equal to that of a region in which the protrusion portion 21 is formed. In the embodiment, since the depth T3 of the recess 23 of the reflective layer 152 is less than the thickness T2 of the recess 23, the through-hole is not formed in the reflective layer 152. Accordingly, it is possible to prevent reflectance of the reflective layer 152 from deteriorating.

By the uneven structure of the lower surface 20 of the reflective layer 152, the capping layer 154 may have an uneven structure or an uneven layer, without being limited thereto. Since the capping layer 154 has an uneven layer, a contact area with the lower surface 20 of the reflective layer 152 can be improved. The area of the lower surface 20 of the reflective layer 152 may be greater than that of the upper surface 10.

FIGS. 3 to 5 are views showing a process of manufacturing the reflective layer of the light emitting device according to the embodiment.

Referring to FIG. 3, the light emitting structure layer 135 is formed and then the contact layer 148 is formed on the light emitting structure layer 135. The contact layer 148 may be formed using a sputtering or deposition method. The contact layer 148 includes any one of transparent conductive oxide or conductive nitride, without being limited thereto.

The reflective layer 152 is formed on the contact layer 148 and the reflective layer 152 may be deposited using an electron beam (E-beam) method or may be formed using a sputtering method or a plating method. The reflective layer 152 may be formed of metal having reflectance of 70% or more of, for example, Ag, Ni, Al, Rh, Pd, Ir, Ru, Mg, Zn, Pt, Au, Hf and a selective alloy thereof and may include a single layer or multiple layers. In addition, the reflective layer 152 may be formed of Ag or an Ag alloy, for example. At this time, the lower and upper surfaces of the reflective layer may be flat.

As shown in FIGS. 4 and 5, when the thickness of the reflective layer 152 is in a range of 700 nm to 1500 nm, in order to improve adhesive properties or electrical properties, the reflective layer 152 is subjected to heat treatment. The heat treatment temperature is in a range of 250° C. to 550° C.

As shown in FIG. 4, when the reflective layer 152 is subjected to heat treatment at a heat treatment temperature of 300° C.±50° C., the lower surface of the reflective layer 152 formed on the contact layer 148 is flat and the upper surface 20 of the reflective layer 152 has the protrusion portions 21 and the recesses 23. Upon heat treatment, the reflective layer 152 moves to minimize a surface area thereof in order to reduce thermal energy and thus the recesses 23 and the protrusion portions 21 having small sizes are formed in the reflective layer 152 by the movement of the reflective layer. Thereafter, as shown in FIG. 5, if the heat treatment temperature of the reflective layer 152 increases to 500° C.±50° C., an uneven structure having the recesses 23 and the protrusion portions 21 having sizes greater than those of the recesses 23 and the protrusion portions 21 of FIG. 4 may be formed in the upper surface 20 of the reflective layer 152. That is, the distance D2 between the protrusion portions 21 of FIG. 5 may be greater than the distance D1 between the protrusion portions 21 of FIG. 4. At this time, the number of recesses 23 and protrusion portions 21 formed in the reflective layer 152 of FIG. 5 is less than that of recesses 23 and protrusion portions 21 formed in the reflective layer 152 of FIG. 4 and the through-hole is not formed in the reflective layer. Since the through-hole is not formed in the reflective layer 152, it is possible to prevent the optical and electrical properties of the reflective layer 152 from deteriorating. The curvature R2 of the protrusion portion 21 of FIG. 5 may be greater than the curvature R2 of the protrusion portion 21 of FIG. 4.

If the thickness of the reflective layer 152 according to the embodiment is less than the above-described thickness, holes may be generated in the reflective layer 152 due to thermal stress upon heat treatment and reflectance may deteriorate due to the holes. As the thickness of the reflective layer 152 decreases, serious thermal degradation phenomenon may occur. In the embodiment, since the thickness of the reflective layer 152 is in a range of 700 nm to 1500 nm, it is possible to suppress a hole from being generated and to reduce thermal degradation phenomenon due to the thin reflective layer.

The capping layer 154 is formed on the reflective layer 152 and the capping layer 154 may be formed using a sputtering or deposition method. The bonding layer may be formed on the capping layer 154 and the support member may be formed on the bonding layer, without being limited thereto.

When the bonding layer and the support member are formed, heat and pressure may be applied such that the properties of the reflective layer do not deteriorate. Since the bonding processing temperature of the bonding layer is less than the heat treatment temperature of the reflective film, the surface of the reflective layer is rarely changed.

FIGS. 6 to 9 are views showing a process of manufacturing a reflective layer of a comparative example.

FIG. 6 shows a state in which an Ag reflective layer 51 having a thickness of 200 nm is deposited and heat treatment is not performed, and FIG. 7 shows a state in which the reflective layer 51 is subjected to heat treatment at 300° C. and thus a plurality of holes 52 is formed in the reflective layer 51. As shown in FIG. 8, when the reflection 51 is subjected to heat treatment at 500° C., the size of the hole 53 of the reflective layer 51 further increases. When the Ag reflective layer 51 is formed and then is subjected to heat treatment, the reflective layer 51 moves to minimize the surface area thereof in order to reduce thermal energy and thus holes 52 and 53 are formed in the reflective layer 51. Thereafter, when the heat treatment temperature increases, the sizes of the holes 52 and 53 further increase and the widths of the protrusion portions of the reflective layer 51 further increase. Therefore, the width of the hole 53 after heat treatment at a high temperature as shown in FIG. 8 may be greater than that of the hole 52 after heat treatment at a low temperature as shown in FIG. 7. As shown in FIG. 9, the reflective layer 51 may be modified to semispherical protrusion portions in order to minimize the surface area thereof. By the reflective layer 51 having the holes 52 and 53, reflectance may deteriorate. In addition, as the number of protrusion portions generated in the reflective layers 51 increases, electrical contact deteriorates and thus electrical reliability decreases. In the comparative example, when the bonding process is performed after forming the reflective layer 51 having a small thickness, the properties of the reflective layer 51 deteriorates due to stress upon additional heat treatment.

FIGS. 10 to 14 are views showing the surface of the reflective layer according to the thickness of the reflective layer.

FIGS. 10 and 11 show reflective layers of comparative examples. FIG. 10 shows an example in which holes 61A are formed in the reflective layer 61 by performing heat treatment at 400° C. in the case where the thickness of the reflective layer 62 is 200 nm. FIG. 11 shows an example in which holes 62A are formed in the reflective layer 61 by performing heat treatment at 400° C. in the case where the thickness of the reflective layer 62 is 500 nm. As shown in FIGS. 10 and 11, as the thicknesses the reflective layers 61 and 62 increase, the sizes of the holes 61A and 62A decrease and the number of holes 61A and 62A decreases.

FIGS. 12 to 14 show the thicknesses of the reflective layers according to the embodiment. As shown in FIG. 12, if the thickness of the reflective layer 63 is 700 nm, when heat treatment is performed at a predetermined temperature, for example, 400° C., a hole is not formed in the reflective layer 63 and an uneven structure having recesses and protrusion portions 63B is formed. As shown in FIG. 13, if the thickness of the reflective layer 64 is 900 nm, when heat treatment is performed at a predetermined temperature, for example, 400° C., a hole is not formed in the reflective layer 64 and an uneven structure having recesses and protrusion portions 64B is formed. As shown in FIG. 14, if the thickness of the reflective layer 65 is 1100 nm, when heat treatment is performed at a predetermined temperature, for example, 400° C., a through-hole is not formed in the reflective layer 65 and an uneven structure having recesses and protrusion portions 65B is formed. As shown in FIGS. 12 to 14, as the thicknesses of the reflective layers 63, 64 and 65 increase, the sizes of the protrusion portions 63B, 64B and 65B increase due to thermal stability and thus the number of protrusion portions decreases. As the thicknesses of the reflective layers 63, 64 and 65 gradually increase from 70 nm, thermal energy is sufficiently reduced and thus agglomeration is reduced.

FIGS. 15(A) to 15(D) are views showing a crystallographic structure of silver (Ag) and an example in which a crystal direction is changed according to thermal energy.

FIG. 15(A) shows a face centered cubic (FCC) of Ag and the closest-packed direction of atoms is a direction (111) among (B), (C) and (D) of FIG. 15. That is, when thermal energy is applied to Ag through heat treatment, the crystal direction (110 or 100) is changed to a direction (111). When the Ag reflective layer has constant directivity in the direction (111), reflectance of Ag can be improved.

FIGS. 16 and 17 show a difference in the crystal direction of Ag according to the thickness of Ag as a result of measuring the crystal direction of Ag using a measurement apparatus, for example, an X-ray diffraction (XRD) apparatus. FIG. 16 shows intensity before heat treatment and FIG. 17 shows intensity after heat treatment, when the thickness of the Ag reflective layer is 200 nm, 500 nm, 700 nm, 900 nm and 1100 nm.

As shown in FIGS. 16 and 17, the Ag reflective layer has highest intensity in the direction (111) when the thickness thereof is 900 nm. When the thickness of the Ag reflective layer is about 900 nm, crystallizability of the Ag reflective layer is excellent.

FIG. 18 is a view showing an average of light output of a wafer using the reflective layer according to an embodiment and comparison between light outputs of adjacent light emitting devices.

Referring to FIG. 18, (A) shows a light output average in the wafer and (B) and (C) show comparison between adjacent chips in the wafer. It can be seen that the light output Po of the reflective layer having a thickness of 900 nm increases as compared to the light output of the comparative example Ref. It can be seen that the light output Po increases by 2.5% or more.

FIG. 19 is a table showing comparison of reflectance between an embodiment and a comparative example after heat treatment and after a bonding process in a wafer. FIG. 20 is a view showing reflectance according to the thickness of the reflective layer of FIG. 19.

As shown in FIGS. 19 and 20, in the case where the thickness of the reflective layer (Ag) is 200 nm, 500 nm, 900 nm and 130 nm, when the reflectance differences Δreflectance of wafers 1, 2 and 3 after heat treatment at a predetermined temperature, e.g., 400° C. and after bonding are compared, it can be seen that the reflectance difference when the thickness of the reflective layer is 900 nm is less than that when the thickness of the reflective layer is 200 nm in the wafers 1, 2 and 3. That is, it can be seen that, when the bonding process is performed after forming the reflective layer, influence of stress caused by heat and pressure is low.

That is, in the case where the thickness of the reflective layer is 200 to 500 nm, the Ag reflective layer does not deteriorate due to heat treatment at a predetermined temperature, e.g., 400° C. but thermal decomposition is generated in the bonding process. Therefore, it can be seen that reflectance deteriorates. In the embodiment, even when the reflective layer having the thickness of 900 nm or more is subjected to a bonding process after heat treatment, reflectance does not further deteriorate.

FIG. 21 is a graph showing comparison of reflectance between an embodiment and a comparative example according to wavelength.

In FIG. 21, a graph showing comparison between the embodiment, in which the thickness of the reflective layer is 900 nm, and the comparative example, in which the thickness of the reflective layer is 200 nm, after heat treatment and after bonding is shown. The reflectance difference of the reflective layer of the comparative example between before bonding and after bonding is greater than that of the reflective layer of the embodiment between before bonding and after bonding.

FIG. 22 is a side cross-sectional view of a light emitting device according to a second embodiment.

Referring to FIG. 22, the light emitting device may includes a light emitting structure layer 135 having a plurality of compound semiconductor layers 110, 120 and 130, a first electrode 116, a contact layer 148, the reflective layer 152 according to the embodiment, a passivation layer 171, a capping layer 154, a bonding layer 174 and a support member 175.

The contact layer 148, the reflective layer 152 and the capping layer 154 are disposed under the light emitting structure layer 135, and the contact layer 148, the reflective layer 152 and the capping layer 154 may be electrically connected to a second conductivity type semiconductor layer 130. The contact layer 148, the reflective layer 152 and the capping layer 154 may define a second electrode layer 150. The reflective layer 152 is the reflective layer disclosed in the first embodiment. For a detailed description of the reflective layer 152, refer to the description of the first embodiment. The reflective layer 152 does not have a through-hole formed therein and the thickness thereof may be in a range of 700 nm to 1500 nm, for example, 800 to 1400 nm or 900 to 1300 nm. The lower surface of the reflective layer 152 may include an uneven structure having a plurality of protrusion portions and a plurality of recesses disposed between the plurality of protrusion portions.

One or a plurality of first electrodes 116 may be provided outside the sidewall of the light emitting structure layer 135 and may contact at least one of the contact layer 148, the reflective layer 152 and the capping layer 154. For the contact layer 148, the reflective layer 152 and the capping layer 154, refer to the description of the first embodiment.

In the embodiment, the thickness of the reflective layer 152 is greater than that of the second conductivity type semiconductor layer 130 or is 20 times that of the contact layer 148. The thickness of the reflective layer 152 may be in a range of 700 to 1500 nm, for example, 800 to 1400 nm or 900 to 1300 nm. If the thickness of the reflective layer 152 is less than 700 nm, a plurality of through-holes and recesses may be formed due to heat treatment and the shapes of the through-holes may be irregular when viewed from the capping layer. In addition, when the thickness of the reflective layer 152 exceeds 1500 nm, the thickness of the light emitting device increases and there is no reflectance difference.

In the embodiment, the reflective layer 152 may have a thickness enough not to form the through-hole in the reflective layer 152. That is, the reflective layer 152 without the hole having the irregular shape may be formed. Here, the hole having the irregular shape is formed by heat treatment and has a shape different from that of a hole formed through etching. Here, the hole having the irregular shape has a depth equal to the thickness of the reflective layer 152 and may be distinguished from a via hole 170.

The capping layer 154 may be formed as an uneven layer according to the uneven structure of the lower surface of the reflective layer 152, without being limited thereto.

The via hole 170 is formed in the light emitting structure layer 135 and the second electrode layer 150. The via hole 170 may be formed from the capping layer 154 to the lower portion of the first conductivity type semiconductor layer 110 and the passivation layer 171 is formed on the circumference thereof.

The passivation layer 171 is disposed between the second electrode layer 150 and the first electrode layer 160A to electrically insulate the second electrode layer 150 and the first electrode layer 160A.

The first electrode layer 160A includes a conductive layer 173, a bonding layer 174 and a support member 175. The conductive layer 173 is disposed under the lower portion of the first conductivity type semiconductor layer 110 and is in contact with the first conductivity type semiconductor layer 110. A portion of the bonding layer 174 extends to the lower portion of the light emitting structure layer 135 and is in contact with the conductive layer 173.

The support member 175 is disposed under the bonding layer 174 to support the light emitting device.

FIG. 23 is a view showing a light emitting device package including a light emitting device according to an embodiment.

Referring to FIG. 23, the light emitting device package according to the embodiment may include a body 120, a first lead electrode 131 and a second lead electrode 132 disposed on the body 120, the light emitting device 100 according to the embodiment, which is provided on the body 120 to electrically connect the first lead electrode 131 and the second lead electrode 132, and a molding member 140 surrounding the light emitting device 100.

The body 120 may include a silicon material, a synthetic resin material or a metal material and includes a cavity having an inclined surface around the light emitting device 100.

The first lead electrode 131 and the second lead electrode 132 are electrically disconnected from each other to supply a voltage to the light emitting device 100. In addition, the first lead electrode 131 and the second lead electrode 132 may reflect light generated in the light emitting device 100 to increase light efficiency and discharge heat generated in the light emitting device 100.

The light emitting device 100 may be disposed on the body 120, the first lead electrode 131 or the second lead electrode 132.

The light emitting device 100 may be electrically connected to the first lead electrode 131 and the second lead electrode 132 using any one of a wiring method, a flip chip method or a die bonding method.

The molding member 140 may surround the light emitting device 100 to protect the light emitting device 100. In addition, phosphors may be included in the molding member 140 to change the wavelength of light emitted from the light emitting device 100.

A plurality of light emitting devices or light emitting device packages according to the embodiment may be arranged on a substrate and a lens, a light guide plate, a prism sheet, a diffusion sheet, etc. which are optical members, may be provided on an optical path of the light emitting device packages. Such light emitting device package, substrate and optical member may function as a light unit. The light unit is implemented in a top view or a side view type and is provided in a display device of a portable terminal and a laptop or is applicable to a lighting device and an indicator device.

Another embodiment may be implemented as a lighting apparatus including the light emitting devices or light emitting device packages according to the above-described embodiments. For example, the lighting apparatus may include a lamp, a streetlamp, an outdoor display board, a headlight, etc. The lighting apparatus according to the embodiment is applicable to the taillight of a vehicle in addition to the headlight.

The light emitting device according to the embodiment is applicable to a light unit. The light unit has a structure in which a plurality of light emitting devices is arranged and may include display apparatuses shown in FIGS. 24 and 25 and a lighting apparatus shown in FIG. 26.

Referring to FIG. 24, the display apparatus 1000 according to the embodiment may include a light guide plate 1041, a light emitting module 1031 for providing light to the light guide plate 1041, a reflective member 1022 disposed under the light guide plate 1041, an optical sheet 1051 disposed on the light guide plate 1041, a display panel 1061 disposed on the optical sheet 1051, and a bottom cover 1011 for accommodating the display panel 1061, the light guide plate 1041, the light emitting module 1031 and the reflective member 1022, without being limited thereto.

The bottom cover 1011, the reflective member 1022, the light guide plate 1041 and the optical sheet 1051 may be defined as a light unit 1050.

The light guide plate 1041 serves to diffuse light to convert light into surface light. The light guide plate 1041 may be formed of a transparent material and may include one of acrylic resin of polymethyl methacrylate (PMMA), polyethylene terephthalate (PET), polycarbonate (PC), cycloolefin copolymer (COP) and polyethylene naphthalate (PEN) resin.

The light emitting module 1031 provides light to at least one side surface of the light guide plate 1041 and functions as a light source of a display apparatus.

At least one light emitting module 1031 may be provided in the bottom cover 1011 to directly or indirectly provide light at one side of the light guide plate 1041. The light emitting module 1031 may include a substrate 1033 and the light emitting devices or light emitting device packages 200 according to the above-described embodiment provided thereon. The light emitting device packages 200 may be arranged on the substrate 1033 at a predetermined interval.

The substrate 1033 may be a printed circuit board (PCB) including a circuit pattern. The substrate 1033 may include a normal PCB, a metal core PCB (MCPCB), a flexible PCB (FPCB), etc., without being limited thereto. If the light emitting device package 200 is provided on the side surface of the bottom cover 1011 or on a heat dissipation plate, the substrate 1033 may be omitted. Here, a portion of the heat dissipating plate may contact an upper surface of the bottom cover 1011.

The plurality of light emitting device packages 200 may be mounted such that an exit surface for emitting light is spaced apart from the light guide plate 1041 by a predetermined distance, without being limited thereto. The light emitting device package 200 may directly or indirectly provide light to an incident surface which is one surface of the light guide plate 1041, without being limited thereto.

The reflective member 1022 may be disposed under the light guide plate 1041. The reflective member 1022 may reflect light incident on the lower surface of the light guide plate 1041 to direct light upward, thereby improving brightness of the light unit 1050. Although the reflective member 1022 may be formed of, for example, PET, PC, PVC resin, etc., the present invention is not limited thereto. Although the reflective member 1022 may be the upper surface of the bottom cover 1011, the present invention is not limited thereto.

The bottom cover 1011 may accommodate the light guide plate 1041, the light emitting module 1031 and the reflective member 1022. To this end, the bottom cover 1011 may include an accommodation part 1012 having a box shape having an opened upper surface thereof, without being limited thereto. The bottom cover 1011 may be coupled to a top cover, without being limited thereto.

The bottom cover 1011 may be formed of a metal material or a resin material and may be manufactured using a press molding process or an extrusion molding process. The bottom cover 1011 may include a metal material having good heat conductivity or a non-metal material, without being limited thereto.

The display panel 1061 is, for example, an LCD panel and includes first and second substrates facing each other and formed of a transparent material and a liquid crystal layer interposed between the first and second substrates. A polarization plate may be attached to at least one surface of the display panel 1061 and the attachment structure of the polarization plate is not limited thereto. The display panel 1061 displays information by light passing through the optical sheet 1051. The display apparatus 1000 is applicable to various mobile terminals, a monitor of a laptop, a television, etc.

The optical sheet 1051 is disposed between the display panel 1061 and the light guide plate 1041 and includes at least one transparent sheet. The optical sheet 1051 may include at least one of a diffusion sheet, a horizontal prism sheet, a vertical prism sheet, and a brightness enhancement sheet. The diffusion sheet diffuses incident light, and the horizontal and/or vertical prism sheets focus incident light onto a display region and the brightness enhancement sheet reuses lost light to enhance brightness. A protective sheet may be provided on the display panel 1061, without being limited thereto.

Here, the light guide plate 1041 and the optical sheet 1051 may be included on the optical path of the light emitting module 1031 as optical members, without being limited thereto.

FIG. 25 is a diagram showing another example of the display apparatus according to the embodiment.

Referring to FIG. 25, the display apparatus 100 may include a bottom cover 1152, a substrate 1020, on which the light emitting devices 100 are arranged, an optical member 1154, and a display panel 1155. The substrate 1020 and the light emitting device package 200 may be defined as a light emitting module 1060. The bottom cover 1152 may include an accommodation part 1153, without being limited thereto.

Here, the optical member 1154 may include at least one of a lens, a light guide plate, a diffusion sheet, horizontal and vertical prism sheets and a brightness enhancement sheet. The light guide plate may be formed of a PC material or a PMMA material and may be omitted. The diffusion sheet diffuses incident light, and the horizontal and/or vertical prism sheets focus incident light onto a display region and the brightness enhancement sheet reuses lost light to enhance brightness.

The optical member 1154 is disposed on the light emitting module 1060 and converts light emitted from the light emitting module 1060 into surface light or diffuses or focus light.

FIG. 26 is a diagram showing a lighting apparatus according to an embodiment.

Referring to FIG. 26, the lighting apparatus according to the embodiment may include a cover 2100, a light source module 2200, a heat dissipating body 2400, a power supply 1600, an inner case 2700, and a socket 2800. In addition, the lighting apparatus according to the embodiment may further include one or more of a member 2300 and a holder 2500. The light source module 220 may include the light emitting device package according to the embodiment.

For example, the cover 2100 has a bulb or semispherical shape, the inside thereof is hollow and a portion thereof is opened. The cover 2100 may be optically coupled to the light source module 2200. For example, the cover 2100 may diffuse, scatter or excite light received from the light source module 2200. The cover 2100 may be an optical member. The cover 2100 may be coupled with the heat dissipating body 2400. The cover 2100 may have a coupling part for coupling with the heat dissipating body 2400.

The inner surface of the cover 2100 may be coated with a milky coating material. The milky coating material may include a diffusion material. The surface roughness of the inner surface of the cover 2100 may be greater than that of the outer surface of the cover 2100, in order to sufficiently diffuse and scatter light from the light source module 220 to emit light.

The material of the cover 2100 may be glass, plastic, polypropylene (PP), polyethylene (PE), polycarbonate (PC), etc. Here, polycarbonate is excellent in terms of light resistance, thermal resistance and strength. The cover 2100 may be transparent such that the light source module 220 is visible from outside or may not be transparent. The cover 2100 may be formed through blow molding.

The light source module 2200 may be disposed on one surface of the heat dissipating body 2400. Accordingly, heat from the light source module 2200 is transferred to the heat dissipating body 2400. The light source module 2200 may include light sources 2210, a connection plate 2230 and a connector 2250.

The member 2300 is disposed on the upper surface of the heat dissipating body 2400 and has guide grooves 2310, into which the plurality of light sources 2210 and the connector 2250 are inserted. The guide grooves 2310 correspond to the substrates of the light sources 2210 and the connector 2250.

The surface of the member 2300 may be applied or coated with a reflective material. For example, the surface of the member 2300 may be applied or coated with a white coating material. The member 2300 reflects light reflecting from the inner surface of the cover 2100 and returning to the light source module 2200 toward the cover 2100 again. Accordingly, light efficiency of the lighting apparatus according to the embodiment can be improved.

The member 2300 may be formed of an insulation material. The connection plate 2230 of the light source module 2200 may include an electrical conduction material. Accordingly, the heat dissipating body 2400 and the connection plate 2230 may be electrically connected to each other. The member 2300 is formed of an insulation material to disconnect the connection plate 2230 and the heat dissipating body 2400. The heat dissipating body 2400 dissipates heat from the light source module 2200 and heat from the power supply 2600.

The holder 2500 blocks the accommodation groove 2719 of the insulation part 2710 of the inner case 2700. Accordingly, the power supply 2600 accommodated in the insulation part 2710 of the inner case 2700 is enclosed. The holder 2500 has a guide protrusion 2610. The guide protrusion 2510 has a hole, through the protrusion 2610 of the power supply 2600 penetrates.

The power supply 2600 processes or converts an external electrical signal and supplies the converted or processed signal to the light source module 2200. The power supply 2600 is accommodated in the accommodation groove 2719 of the inner case 2700 and is enclosed in the inner case 2700 by the holder 2500. The power supply 2600 may include the protrusion 2610, a guide 2630, a base 2650 and an extension 2670.

The guide 2630 protrudes from one side of the base 2650 outwardly. The guide 2630 may be inserted into the holder 2500. A plurality of parts may be disposed on one surface of the base 2650. The plurality of parts may include, for example, an AC-DC converter for converting an AC voltage received from an external power supply into a DC voltage, a driving chip for controlling driving of the light source module 2200, and an electrostatic discharge (ESD) protection device for protecting the light source module 220, without being limited thereto.

The extension 2670 protrudes from another side of the base 2650 outwardly. The extension 2670 is inserted into the connector 2750 of the inner case 2700 to receive an external electrical signal. For example, the width of the extension 2670 may be equal to or less than that of the connector 2750 of the inner case 2700. One end of each of a "+wire" and a "−wire" is electrically connected to the extension 2670 and the other end of each of the "+wire" and the "−wire" is electrically connected to the socket 2800.

The inner case 2700 may include a molding part provided therein in addition to the power supply 2600. The molding part is obtained by hardening molding liquid and fixes the power supply 2600 in the inner case 2700.

The embodiment can improve the light output of the light emitting device. The embodiment provides a light emitting device for improving reflectance of a reflective layer disposed under a light emitting structure layer. The embodiment can improve optical property deterioration of a light emitting device. The embodiment can improve reliability of a light emitting device and a light emitting device package, lighting apparatus and display apparatus including the same.

The features, structures and effects of the embodiments are included in at least one embodiment of the present invention and are not limited to one embodiment. Further, the features, structures and effects of each embodiment may be combined or modified by those skilled in the art in other embodiments. Accordingly, the description related to such combinations and modifications should be interpreted as being within the scope of the present invention.

Although the preferred embodiments have been disclosed, the embodiments are purely exemplary and do not limit the present disclosure. Those skilled in the art will appreciate that various modifications and applications are possible, without departing from the embodiments. For example, the components described in the embodiments may be modified and embodied. Further, differences related to such modifications and applications should be interpreted as being within the scope of the present disclosure defined by the accompanying claims.

INDUSTRIAL APPLICABILITY

Embodiments can improve reliability of a light emitting device.

The light emitting device according to embodiments is applicable to a lighting apparatus such as an illumination lamp, an indoor lamp, an outdoor lamp, an indicator lamp and a headlight using an LED.

The invention claimed is:
1. A light emitting device comprising:
  a light emitting structure layer including a first conductivity type semiconductor layer, a second conductivity type semiconductor layer disposed under the first conductivity type semiconductor layer and an active layer disposed between the first conductivity type semiconductor layer and the second conductivity type semiconductor layer;
  a first electrode electrically connected to the first conductivity type semiconductor layer;
  a contact layer disposed under the second conductivity type semiconductor layer and formed of a conductive material;
  a reflective layer disposed under the contact layer;
  a capping layer disposed under the reflective layer; and
  a conductive support member disposed under the capping layer,
  wherein a thickness of the reflective layer is greater than that of the second conductivity type semiconductor layer and is 90 or more times that of the contact layer, wherein a lower surface of the reflective layer includes a plurality of protrusion portions and a plurality of recesses disposed between the plurality of protrusion portions, wherein the lower surface of the reflective layer includes an uneven structure with respect to a horizontal top surface of the conductive support member, wherein the reflective layer is formed of Ag, wherein the reflective layer is formed of a single layer, and wherein the thickness of the reflective layer is 15 or more times that of the cap ping layer.

2. The light emitting device according to claim 1, wherein the thickness of the reflective layer is in a range of 900 nm to 1300 nm.

3. The light emitting device according to claim 2, wherein an area of the lower surface of the reflective layer is greater than that of an upper surface of the reflective layer.

4. The light emitting device according to claim 3, wherein the capping layer includes an uneven layer along the lower surface of the reflective layer.

5. The light emitting device according to claim 3, wherein a bonding layer is included between the capping layer and the support member.

6. The light emitting device according to claim 1, further comprising an insulating layer disposed on side and upper surfaces of the first conductivity type semiconductor layer, wherein the first electrode is disposed on the first conductivity type semiconductor layer and is electrically connected to the first conductivity type semiconductor layer.

7. The light emitting device according to claim 1, wherein each of the plurality of protrusion portions has a curved surface.

8. The light emitting device according to claim 1, wherein each of the plurality of protrusion portions has a convex surface in a direction of the capping layer.

9. The light emitting device according to claim 1, further comprising an insulating layer disposed on side surfaces and an upper surface of the first conductivity type semiconductor layer, wherein the first electrode is disposed on the first conductivity type semiconductor layer and is electrically connected to the first conductivity type semiconductor layer, and wherein the upper surface of the first conductivity type semiconductor layer has a light extraction structure.

10. A light emitting device comprising:
a light emitting structure layer including a first conductivity type semiconductor layer, a second conductivity type semiconductor layer disposed under the first conductivity type semiconductor layer and an active layer disposed between the first conductivity type semiconductor layer and the second conductivity type semiconductor layer;
a first electrode electrically connected to the first conductivity type semiconductor layer;
a contact layer disposed under the second conductivity type semiconductor layer and formed of a conductive material;
a reflective layer disposed under the contact layer;
a capping layer disposed under the reflective layer; and
a conductive support member disposed under the capping layer, wherein a thickness of the reflective layer is greater than that of the second conductivity type semiconductor layer and is 90 or more times that of the contact layer, wherein a lower surface of the reflective layer includes a plurality of protrusion portions and a plurality of recesses disposed between the plurality of protrusion portions, wherein the lower surface of the reflective layer includes an uneven structure with respect to a horizontal top surface of the conductive support member, wherein the thickness of the reflective layer is greater than 15 or more times that of the capping layer, and wherein a depth of each of the recesses is less than 50% of the thickness of the reflective layer.

11. The light emitting device according to claim 10, wherein the protrusion portions have a semi-spherical shape.

12. The light emitting device according to claim 10, wherein the depth of each of the recesses has a range of 100 nm to 400 nm.

13. The light emitting device according to claim 10, wherein an area of the lower surface of the reflective layer is greater than that of an upper surface of the reflective layer.

14. The light emitting device according to claim 13, wherein the reflective layer is formed of Ag.

15. The light emitting device according to claim 14, wherein the thickness of the reflective layer is in a range of 900 nm to 1300 nm.

16. The light emitting device according to claim 15, wherein the contact layer includes a transparent conductive material.

17. The light emitting device according to claim 16, wherein:
a bonding layer is disposed between the capping layer and the conductive support member,
the first conductivity type semiconductor layer includes an n-type semiconductor layer, and
the second conductivity type semiconductor layer includes a p-type semiconductor layer.

18. The light emitting device according to claim 10, wherein the reflective layer is formed of a single layer formed of Ag.

19. The light emitting device according to claim 10, wherein each of the plurality of protrusion portions has a curved surface.

20. The light emitting device according to claim 10, wherein each of the plurality of protrusion portions has a convex surface in a direction of the capping layer.

* * * * *